United States Patent
Itaka et al.

(10) Patent No.: US 6,741,100 B2
(45) Date of Patent: May 25, 2004

(54) SEMICONDUCTOR INTEGRATED CIRCUIT CAPABLE OF HIGH-SPEED CIRCUIT OPERATION

(75) Inventors: Yasuhito Itaka, Yokohama (JP); Takayuki Kamei, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 10/175,786

(22) Filed: Jun. 21, 2002

(65) Prior Publication Data

US 2003/0210075 A1 Nov. 13, 2003

(30) Foreign Application Priority Data

May 13, 2002 (JP) ........................................ 2002-137269

(51) Int. Cl.$^7$ ............................................... H03K 19/00
(52) U.S. Cl. .............................. 326/93; 326/17; 326/35; 326/36
(58) Field of Search ............................... 326/93, 17, 99, 326/83, 35, 36; 327/170, 108

(56) References Cited

U.S. PATENT DOCUMENTS

| | | | |
|---|---|---|---|
| 5,495,188 A | * | 2/1996 | Chen et al. |
| 5,517,136 A | * | 5/1996 | Harris et al. ................... 326/93 |
| 6,154,045 A | * | 11/2000 | Ye et al. |
| 2002/0008545 A1 | * | 1/2002 | Zama et al. ................... 326/93 |

* cited by examiner

Primary Examiner—Anh Tran
(74) Attorney, Agent, or Firm—Oblon, Spivak, McClelland, Maier & Neustadt, P.C.

(57) ABSTRACT

In a standard cell, rise time when an output transitions from a low-level voltage to a high-level voltage and fall time when an output transitions from the high-level voltage to the low-level voltage differ from each other. A flip-flop outputs a first input signal, which is input in a cycle immediately before a clock in synchronization with one of rise and fall of the clock, to the standard cell and then fixes an output the signal at one of a high-level voltage and a low-level voltage. Before a second input signal, which is output from the flip-flop after the first input signal, reaches the standard cell, an output of the standard cell is set at one of a high-level voltage and a low-level voltage, which corresponds to a signal whose transition speed is slow, by one of the high-level voltage and the low-level voltage that is output from the flip-flop.

17 Claims, 11 Drawing Sheets

Logical polynomial
D=X|Y
E=C&D
Z1=A&B&E

SEMICONDUCTOR INTEGRATED CIRCUIT CAPABLE OF HIGH-SPEED CIRCUIT OPERATION

CROSS-REFERENCE TO RELATED APPLICATIONS

This application is based upon and claims the benefit of priority from the prior Japanese Patent Application No. 2002-137269, filed May 13, 2002, the entire contents of which are incorporated herein by reference.

BACKGROUND OF THE INVENTION

1. Field of the Invention

The present invention relates to a high-speed circuit operation of a semiconductor integrated circuit.

2. Description of the Related Art

FIG. 1 is a graph showing a relationship between the size ratio of an n-channel MOS transistor to a p-channel MOS transistor (Wn/Wp) and each of rise delay time and fall delay time in a semiconductor integrated circuit. As is seen from this graph, the larger the size of the n-channel MOS transistor, the shorter the fall delay time, whereas the smaller the size of the p-channel MOS transistor, the longer the rise delay time.

In the design of prior art semiconductor integrated circuits, two transitions from a low-level voltage to a high-level voltage and from a high-level voltage to a low-level voltage are effected. The Semiconductor integrated circuits are usually so designed that rise delay time and fall delay time become equal to each other. The reason is as follows. If these two times differ from each other, a signal is delayed in transmission due to a slower transition and thus an operating frequency cannot be increased.

In a domino circuit, only one of rise and fall transitions is considered to be significant. The domino circuit can thus be designed so as to increase the speed of only one transition.

In the domino circuit, however, once a signal makes a transition, it cannot be restored. Therefore, only the positive logic that limits the transition to one direction can be treated, thus increasing the number of logic stages in the circuit. Since the domino circuit is susceptible to noise, it is difficult to design automatically.

BRIEF SUMMARY OF THE INVENTION

A semiconductor integrated circuit according to an aspect of the present invention comprises a standard cell in which rise time when an output transitions from a low-level voltage to a high-level voltage and fall time when an output transitions from the high-level voltage to the low-level voltage differ from each other and a flip-flop which outputs a first input signal, which is input in a cycle immediately before a clock signal in synchronization with one of rise and fall of the clock signal, to the standard cell and then fixes an output at one of a high-level voltage and a low-level voltage, the flip-flop being provided in a stage precedent to the standard cell, wherein before a second input signal, which is output from the flip-flop after the first input signal, reaches the standard cell, an output of the standard cell is set at one of a high-level voltage and a low-level voltage, which corresponds to a signal whose transition speed is slow, by one of the high-level voltage and the low-level voltage that is output from the flip-flop.

A method of designing a semiconductor integrated circuit according to another aspect of the present invention, com-prises expressing a logic circuit having standard cells by a logical polynomial, searching the logical polynomial for complementary signals, duplicating a logical polynomial to generate the complementary signals when the complementary signals are detected, forming a logic circuit in accordance with the duplicated logical polynomial, and increasing one of a rise transition and a fall transition in speed in each of the standard cells.

DETAILED DESCRIPTION OF THE INVENTION

Figure 1:
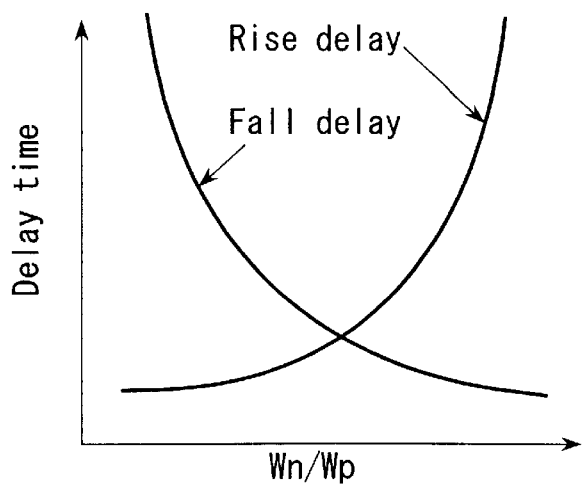
FIG. 1 is a graph showing a relationship between the size ratio of an n-channel MOS transistor to a p-channel MOS transistor (Wn/Wp) and each of rise delay time and fall delay time in a semiconductor integrated circuit.

Embodiments of the present invention will now be described with reference to the accompanying drawings. The components common to the embodiments are denoted by the same reference numerals throughout the specification and drawings.

First Embodiment

A semiconductor integrated circuit according to a first embodiment of the present invention will now be described.

First, a standard cell is designed in which rise and fall times of an output differ from each other. Such a standard cell can easily be designed by varying is size between n- and p-channel MOS transistors.

If only one of transition times is quicken, the other transition time will naturally be delayed. In order to avoid this, a technique for causing a signal to transition in advance in a slower-transition direction in the preceding cycle and causing the original signal to transition in a direction when necessary. According to this technique, the signal transitions in a faster transition direction, it can be transmitted at high speed.

Figure 2A:
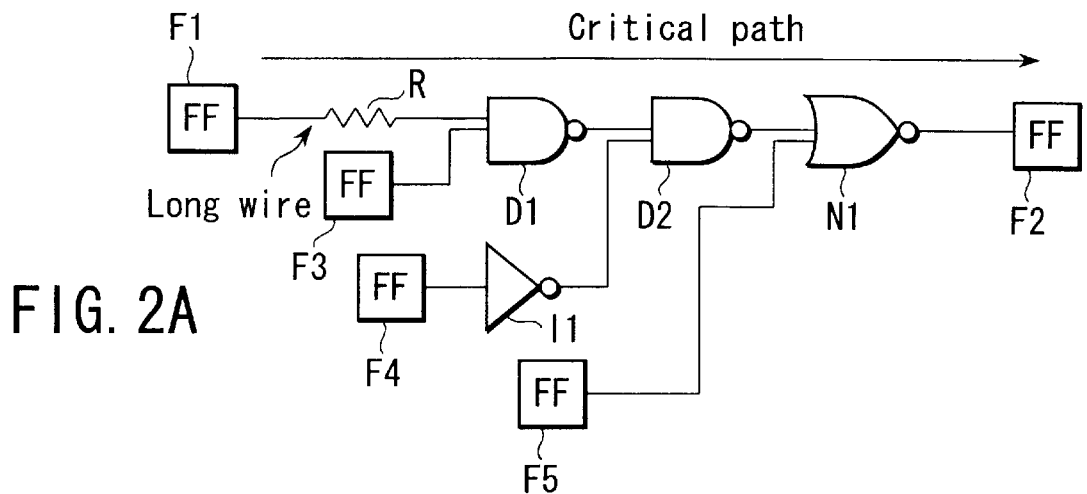
FIGS. 2A to 2C are logic circuit diagrams of the arrangement of a semiconductor integrated circuit according to a first embodiment of the present invention.
Figure 2B:
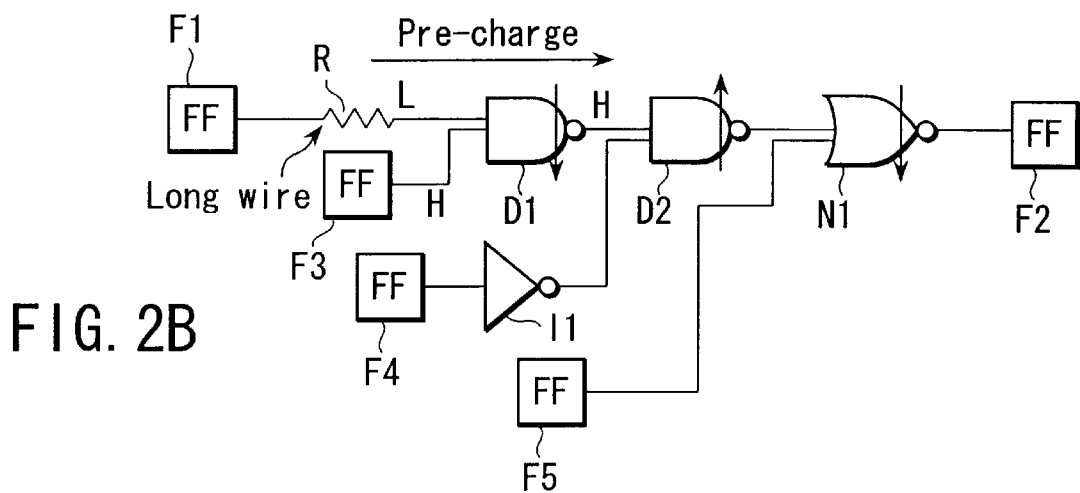
Figure 2C:
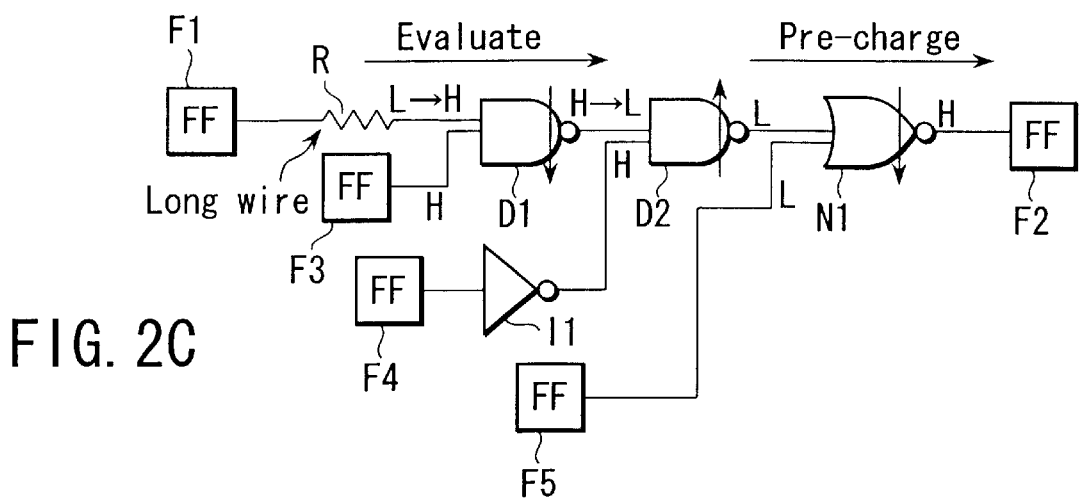

FIGS. 2A to 2C each show a tree of circuits between flip-flops.

A resistor R, NAND circuits D1 and D2, and a NOR circuit N1 are connected between flip-flops F1 and F2. The flip-flop F1 is connected to a first input node of the NAND circuit D1 via the resistor R caused due to a long wire. A flip-flop F3 is connected to a second input node of the NAND circuit D1. The output node of the NAND circuit D1 is connected to a first input node of the NAND circuit D2. A flip-flop F4 is connected to a second input node of the NAND circuit D2 via an inverter I1. Further, the output node of the NAND circuit D2 is connected to a first input node of the NOR circuit N1. A flip-flop F5 is connected to a second input node of the NOR circuit N1.

In the circuit shown in FIG. 2A, a signal line passing through the resistor R, NAND circuits D1 and D2, and NOR circuit N1 is a critical path. To increase the speed of the critical path allows the entire circuit to increase in speed. If the delay time of the critical path is very long, a signal passing through another path connected to the critical path can be considered to be much faster than a signal passing through the critical path.

First, as shown in FIG. 2B, a signal that transitions in advance in a slow transition direction (referred to as a pre-charge signal hereinafter) is transmitted to the first input node of the NAND circuit D1. The flip-flop F1 supplies a low-level signal to the first input node of the NAND circuit D1, while the flip-flop F3 supplies a high-level signal to the second input node thereof. Thus, the NAND circuit D1 is caused to transition in advance to the low-level side on which transition speed is slow. When a low-level signal is supplied to the second input node from the flip-flop F3, the output of the NAND circuit D1 always becomes a high level irrespective of the signal transmitted to the first input node. Therefore, no critical path is formed between the flip-flop F1 and NAND circuit D1.

After that, as shown in FIG. 2C, an original signal (referred to as an evaluate signal hereinafter) is sent to the first input node of the NAND circuit D1. If a transition is made to the high level in the NAND circuit D1 by the evaluate signal, it is a faster one and thus the critical path can be increased in transmission speed.

Figure 3:
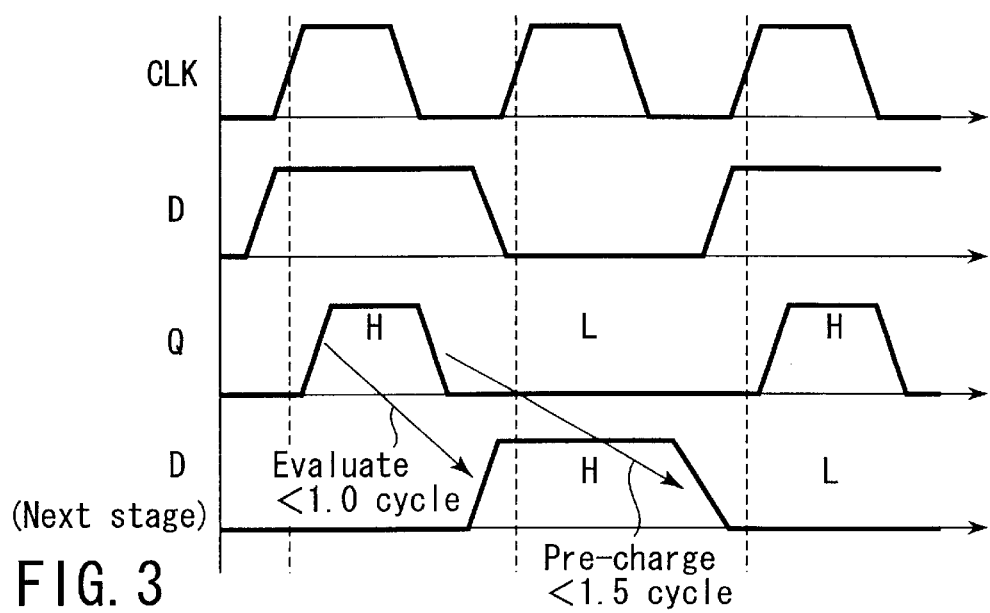
FIG. 3 is a timing chart of pre-charge and evaluate signals in the semiconductor integrated circuit according to the first embodiment.
Figure 4:
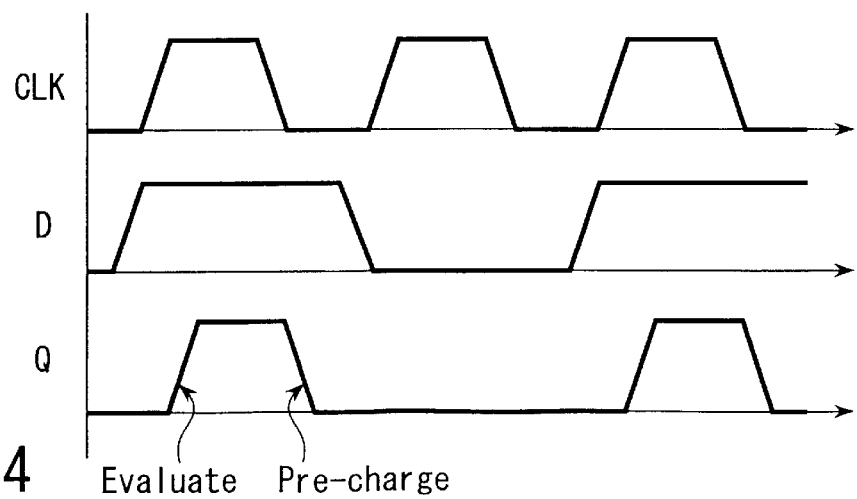
FIG. 4 is a timing chart of timing at which a pre-charge signal is transmitted after half the cycle of an evaluate signal in the semiconductor integrated circuit according to the first embodiment.

FIG. 3 is a timing chart of a pre-charge signal and an evaluate signal. The rise of signal Q output from the flip-flop F1 corresponds to the evaluate signal, while the fall of signal Q corresponds to the pre-charge signal. A flip-flop that does not fail to transmit the pre-charge signal after half the cycle of the evaluate signal as shown in FIG. 4 is designed. Using such a flip-flop, the pre-charge signal can be transmitted before the evaluate signal is input. The circuit shown in FIG. 5 or 6 can achieve the flip-flop.

Figure 5:
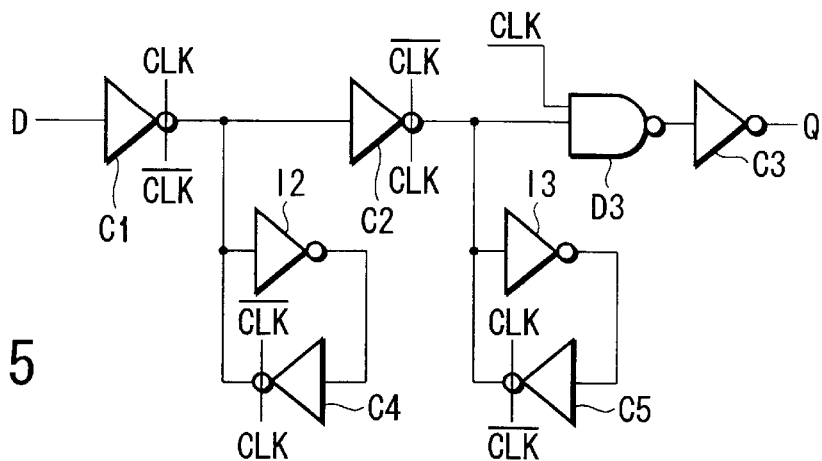
FIG. 5 is a circuit diagram of a first example of a circuit including a flip-flop that generates the timing shown in FIG. 4.
Figure 6:
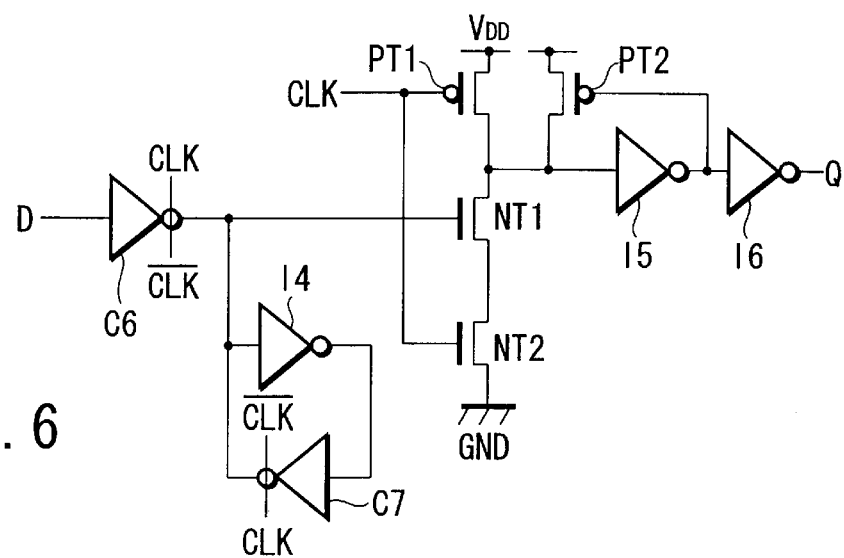
FIG. 6 is a circuit diagram of a second example of a circuit including a flip-flop that generates the timing shown in FIG. 4.

FIGS. 5 and 6 are circuit diagrams of a flip-flop that outputs a signal D only during half the cycle. In the flip-flop shown in FIG. 5, a signal D is input to a clocked inverter C1. The output node of the clocked inverter C1 is connected to a clocked inverter C2, a NAND circuit D3, and a clocked inverter C3, which are connected in series. An inverter I2 and a clocked inverter C4 composing a latch circuit are connected between the clocked inverters C1 and C2. An inverter I3 and a clocked inverter C5 composing a latch circuit are connected between the clocked inverter C2 and NAND circuit D3.

In the flip-flop shown in FIG. 6, a signal D is input to a clocked inverter C6. The output node of the clocked inverter C6 is connected to the gate of an n-channel MOS transistor NT1. An inverter I4 and a clocked inverter C7 composing a latch circuit are connected between the clocked inverter C6 and the gate of the n-channel MOS transistor NT1. The source of the n-channel MOS transistor NT1 is connected to a ground via an n-channel MOS transistor NT2, and the drain of the n-channel MOS transistor NT1 is connected to a power supply VDD via a p-channel MOS transistor PT1 and a p-channel MOS transistor PT2. The drain of the n-channel MOS transistor NT1 is connected to an inverter I5 and the output node of the inverter I5 is connected to an inverter I6. The gates of the p- and n-channel MOS transistors PT1 and NT2 are supplied with a clock signal CLK. The gate of the p-channel MOS transistor PT2 is connected between the inverters I5 and I6.

The above evaluate signal has to be transmitted between the flip-flops F1 and F2 within one cycle, whereas the pre-charge signal has only to be done within one and a half cycles. The evaluate signal is transmitted within one cycle by increasing the speed of one of rise and fall transitions in the NAND circuits D1 and D2 and NOR circuit N1. The other transition has only to be set such that the signal can be transmitted within one and a half cycles.

Figure 7:
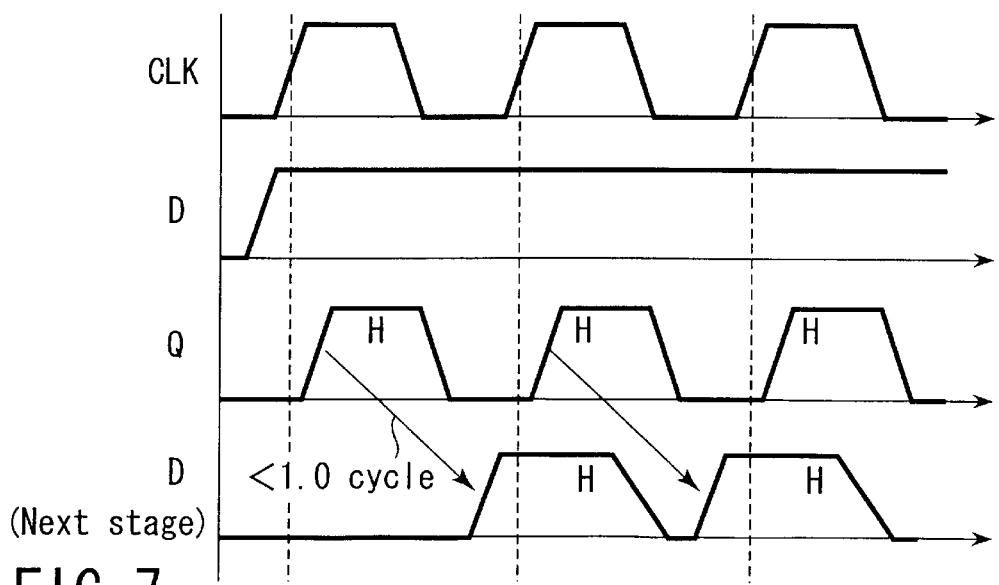
FIG. 7 is a timing chart showing an operation performed when the outputs of NAND and NOR circuits are continuously changed in level in the semiconductor integrated circuit according to the first embodiment.

Even though the evaluate signal output from the flip-flop F1 continuously changes the levels of outputs of the NAND and NOR circuits as shown in FIG. 7, the evaluate signal always reaches the flip-flop F2 in the next stage before the flip-flop F2 starts to operate. No influence is therefore exerted upon the next stage. In other words, neither the flip-flop F2 nor its subsequent circuits malfunction.

The arrangement and operations of the semiconductor integrated circuit according to the first embodiment are summarized as follows.

As depicted in FIG. 2B, the semiconductor integrated circuit includes a NAND circuit D1 and a flip-flop F1 as standard cells. In the NAND circuit D1, rise time when an output transitions from a low-level voltage to a high-level voltage and fall time when an output transitions from a high-level voltage to a low-level voltage differ from each other. The flip-flop F1 is provided in the stage precedent to the NAND circuit D1. The flip-flop F1 outputs a first input signal, which is input in a cycle immediately before a clock signal in synchronization with the rise or fall of the clock signal, to the NAND circuit D1 and then fixes it at one of high- and low-level voltages. Before a second input signal, which is output from the flip-flop F1 after the first input signal, reaches the NAND circuit D1, an output of the NAND circuit D1 is set at one of high- and low-level voltages, which corresponds to a signal whose transition speed is slow, by one of high- and low-level voltages output from the flip-flop F1.

The above paragraph can be translated as follows.

As depicted in FIG. 2B, the semiconductor integrated circuit includes a NAND circuit D1 and a flip-flop F1 as standard cells. In the NAND circuit D1, rise time when an output transitions from a low-level voltage to a high-level voltage and fall time when an output transitions from a high-level voltage to a low-level voltage differ from each other. The flip-flop F1 is provided in the stage precedent to the NAND circuit D1. The flip-flop F1 outputs an input signal, which is input in a cycle immediately before a clock signal, during one of high- and low-level periods of the clock signal and fixes it at one of high- and low-level voltages during the other period. Before the flip-flop F1 outputs the input signal, it sets the output of the NAND circuit D1 at one of high- and low-level voltages that corresponds to a signal whose transition speed is slow.

According to the first embodiment described above, a pre-charge signal, which transitions in advance in a slower-transition direction, is input to a logic circuit element and the original signal is caused to transition in a direction when necessary. The signal can thus be transmitted at high speed.

Second Embodiment

A semiconductor integrated circuit according to a second embodiment of the present invention will now be described.

The first embodiment has the problem that a semiconductor integrated circuit malfunctions if a pre-charge signal is transmitted within half a cycle when an operating frequency lowers in the operation test mode. Therefore, a clock signal whose high- and low-level periods differ from each other has only to be prepared for the test mode to operate the semiconductor integrated circuit.

Figure 8:
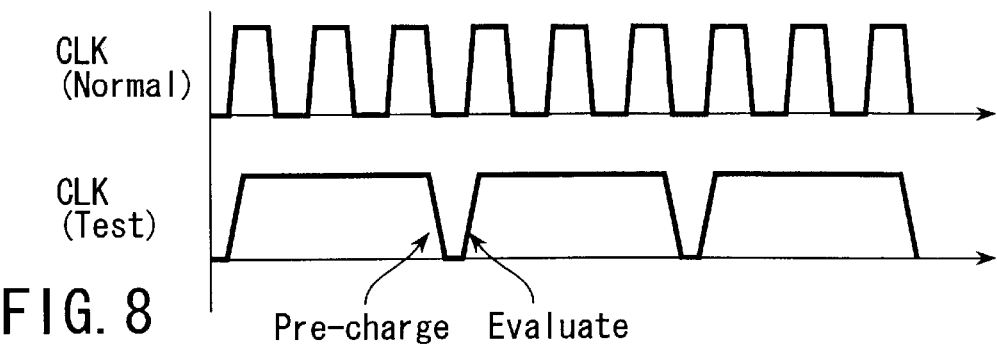
FIG. 8 is a timing chart of a clock signal whose high- and low-level periods differ from each other.

FIG. 8 is a timing chart of a clock signal whose high- and low-level periods differ from each other. In this clock signal, a period from when a pre-charge signal is output until an evaluate signal is done is fixed. No pre-charge signals therefore propagate to cause the circuit to malfunction. The signal as shown in FIG. 8 can be generated by adding a counter to the outside of a PLL circuit.

Third Embodiment

A semiconductor integrated circuit according to a third embodiment of the present invention will now be described. Like the second embodiment, the third embodiment is directed to a method of achieving a circuit for securing an operation performed at low frequencies.

The circuit according to the third embodiment employs a latch (which is the same as used for designing a normal semiconductor integrated circuit) that outputs a signal in half the cycle of a clock signal and latches the output signal in the remaining half cycle. Let us consider a circuit using a flip-flop that outputs a signal the instant that the level of a clock signal becomes high. A latch, which outputs an input signal as it is while a clock signal is at a high level and latches the output signal while the clock signal is at a low level, is inserted in a path between flip-flops F11 and F12 to prevent a pre-charge signal from being transmitted.

Figure 9:
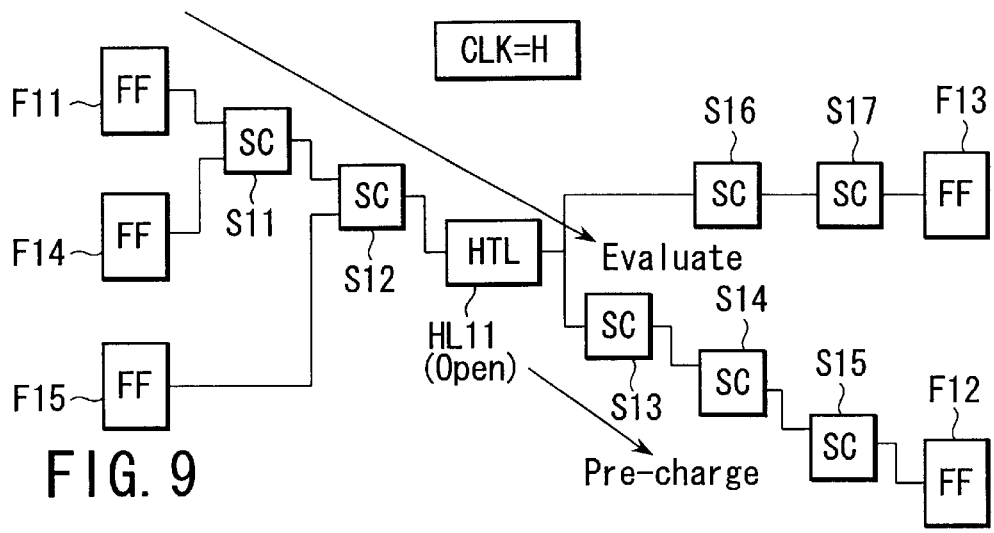
FIGS. 9 and 10 are block diagrams of the arrangement of a semiconductor integrated circuit according to a third embodiment of the present invention.
Figure 10:
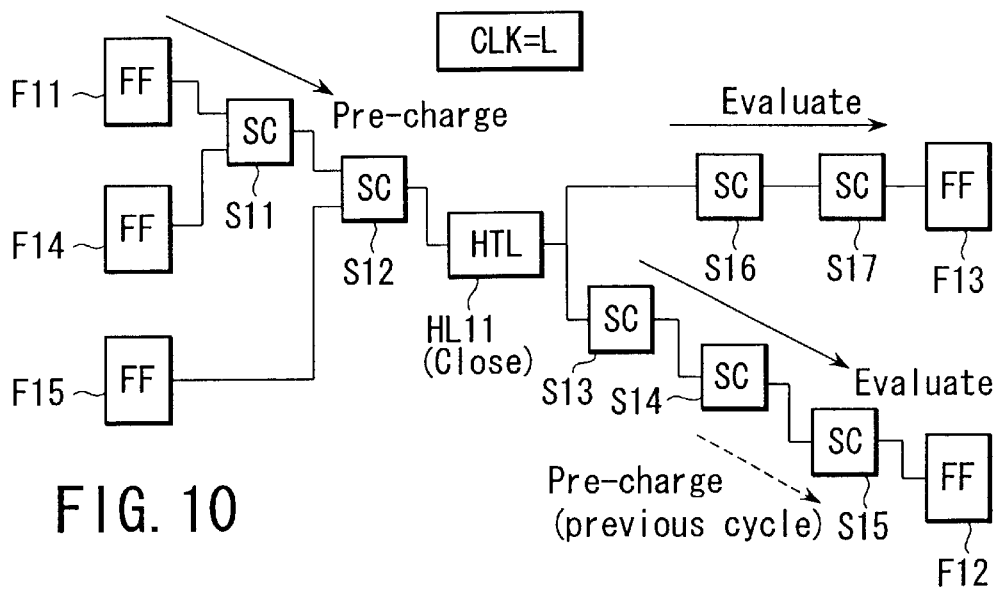

FIGS. 9 and 10 are block diagrams showing an arrangement of the semiconductor integrated circuit according to the third embodiment.

The flip-flop F11 is connected to a high-through latch HL11 via standard cells S11 and S12. The high-through latch HL11 is connected to the flip-flop F12 via standard cells S13, S14 and S15 and connected to a flip-flop F13 via standard cells S16 and S17. Flip-flops F14 and F15 are connected to the standard cells S11 and S12, respectively.

In the circuit so arranged, the flip-flop F11 outputs an evaluate signal while a clock signal is at a high level, as shown in FIG. 9. The circuit is so designed that the evaluate signal passes through the high-through latch HL11 during this period. Conversely, the high-through latch HL11 is inserted in such a position as to cause the evaluate signal to pass.

As shown in FIG. 10, the flip-flop F11 outputs a pre-charge signal and closes the high-through latch HL11 after a half cycle of the clock signal (while the clock signal at a low level). Thus, the pre-charge signal stops at the entrance of the high-through latch HL11. Since the evaluate signal reaches the entrances of the flip-flops F12 and F13, it can be transmitted correctly.

The high-through latch HL11 outputs a pre-charge signal the instant that the level of the clock signal becomes high. Concurrently with this, the flip-flop F11 in the preceding stage outputs an evaluate signal. If the evaluate signal needs to transition, it pursues the pre-charge signal output from the high-through latch HL11 and vanishes it. This is because the evaluate signal is transmitted faster than the pre-charge signal.

On the other hand, if the evaluate signal does not need to transition, the pre-charge signal has only to reach the flip-flops F12 and F13 in the succeeding stages until the level of the clock signal becomes high. Since the pre-charge signal is transmitted in one and a half cycles between the flip-flop F11 and flip flop F12 (or F13), it is processed correctly.

Figure 11A:
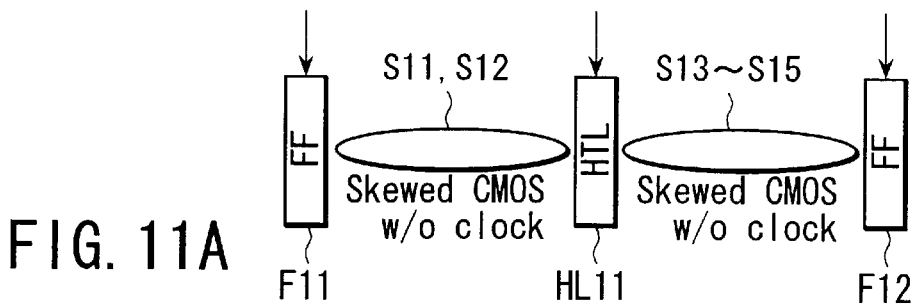
FIG. 11A is a schematic view of the arrangement of the semiconductor integrated circuit according to the third embodiment of the present invention.
Figure 11B:
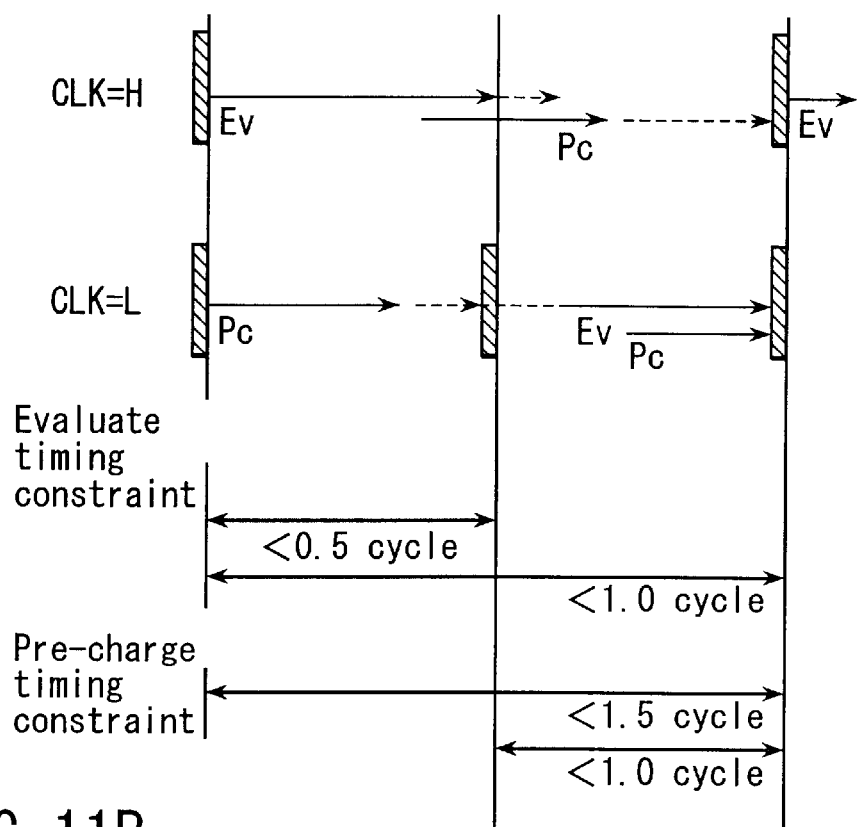
FIG. 11B is a schematic view of timing constraints of an evaluate (Ev) signal and a pre-charge (Pc) signal in the circuits shown in FIG. 11A.

FIG. 11A is a schematic diagram of the circuit arrangement of the semiconductor integrated circuit according to the third embodiment. FIG. 11B is a schematic diagram of timing constraint of evaluate signal (Ev) and pre-charge signal (Pc) in the circuit.

As shown in FIG. 11A, the flip-flop F11 is connected to the high-through latch HL11 via the standard cells S11 and S12 having a cMOS circuit. The high-through latch HL11 is connected to the flip-flop F12 via the standard cells S13 to S15 having a cMOS circuit. The high-through latch HL11 is interposed between the flip-flops F11 and F12 such that the pre-charge signal output from the flip-flop F11 is not transmitted to the flip-flop F12 of the succeeding stage within half a cycle.

Figure 12:
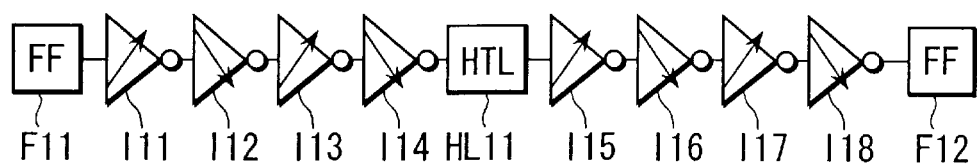
FIG. 12 is a circuit diagram showing a specific example of the semiconductor integrated circuit according to the third embodiment of the present invention.

FIG. 12 shows a concrete example of the third embodiment, in which the semiconductor integrated circuit is applied to a repeater for reducing a wiring delay. Series-connected inverters I11 to I14 are arranged between the flip-flop F11 and the high-through latch HL11. Further, series connected inverters I15 and I18 are arranged between the high-through latch HL11 and the flip-flop F12.

The arrangement and operations of the semiconductor integrated circuit according to the third embodiment are summarized as follows.

The semiconductor integrated circuit of the third embodiment comprises a latch circuit HL11 in addition to the constituting elements of the circuit of the first embodiment. The latch circuit HL11 outputs an input signal as it is during one of periods of high- and low-level clock signals and holds the input signal during the other period. As shown in FIG. 9, the latch circuit HL11 is closed while the flip-flop F11 outputs one of high- and low-level voltages, which corresponds to a signal whose transition speed is slow, to thereby prevent the one of high- and low-level voltages from reaching the flip-flop F12 arranged in the stage succeeding to the flip-flop F11.

As described above, the circuit of the third embodiment can correctly be operated according to the timing of pre-charge and evaluate signals even though the operating frequency is low.

Fourth Embodiment

A semiconductor integrated circuit according to a fourth embodiment of the present invention will now be described. The circuit of the fourth embodiment employs a cell that does not receive a pre-charge signal from a flip-flop in the preceding stage but can receive it as a clock signal directly in order to ease timing constraint of the pre-charge signal.

Figures 13A, 13B, 13C:
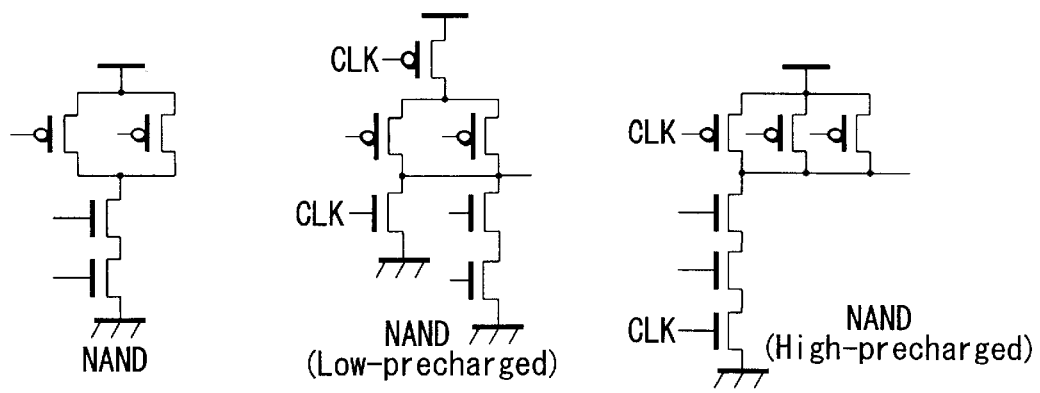
FIGS. 13A to 13C are circuit diagrams of a semiconductor integrated circuit according to a fourth embodiment of the present invention, each showing an example where a clock signal is directly used as a pre-charge signal.

FIGS. 13A to 13C are circuit diagrams each showing an example in which an input clock signal is directly used as a pre-charge signal. FIG. 13A shows a normal NAND circuit, FIG. 13B shows a NAND circuit in which an output signal transitions to a low-level side on which transition speed is slow, and FIG. 13C shows a NAND circuit in which an output signal transitions to a low-level side on which transition speed is slow. Hereinafter, an operation of causing an output signal to transition in advance to a low- or high-level side on which transition speed is slow, is referred to as pre-charge.

The circuits shown in FIGS. 13A and 13B make it possible to design a circuit for pre-charging an output signal at a high or low level. In the circuit for pre-charging an output signal at a high level, a signal that transitions to a low level is an evaluate signal. Thus, the size of an n-channel MOS transistor increases to quicken the transition from a high level to a low level. Conversely, in the circuit for pre-charging an output signal at a low level, a signal that transitions to a high level is an evaluate signal. Thus, the size of a p-channel MOS transistor increases to quicken the transition from a low level to a high level.

Figure 14A:
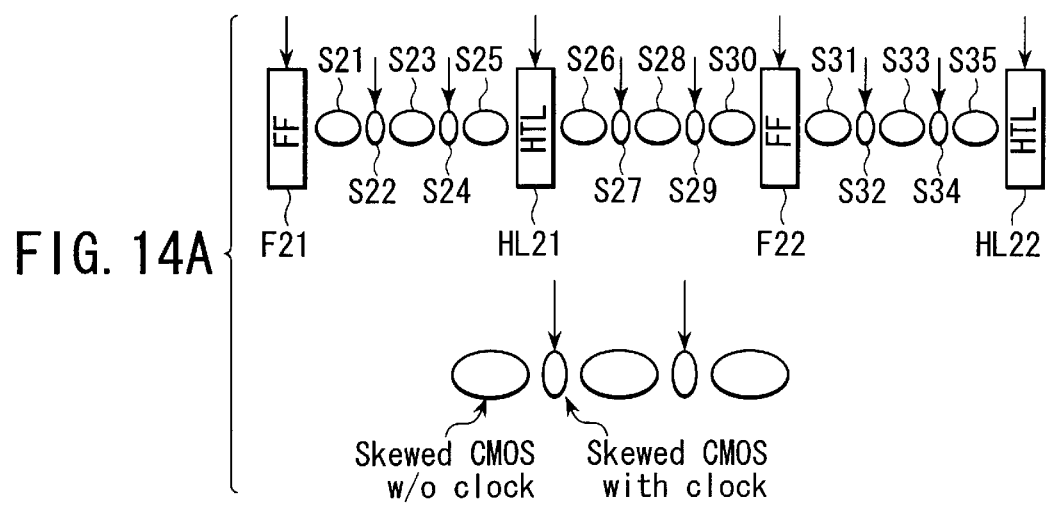
FIG. 14A is a schematic view of the arrangement of the semiconductor integrated circuit according to the fourth embodiment of the present invention.
Figure 14B:
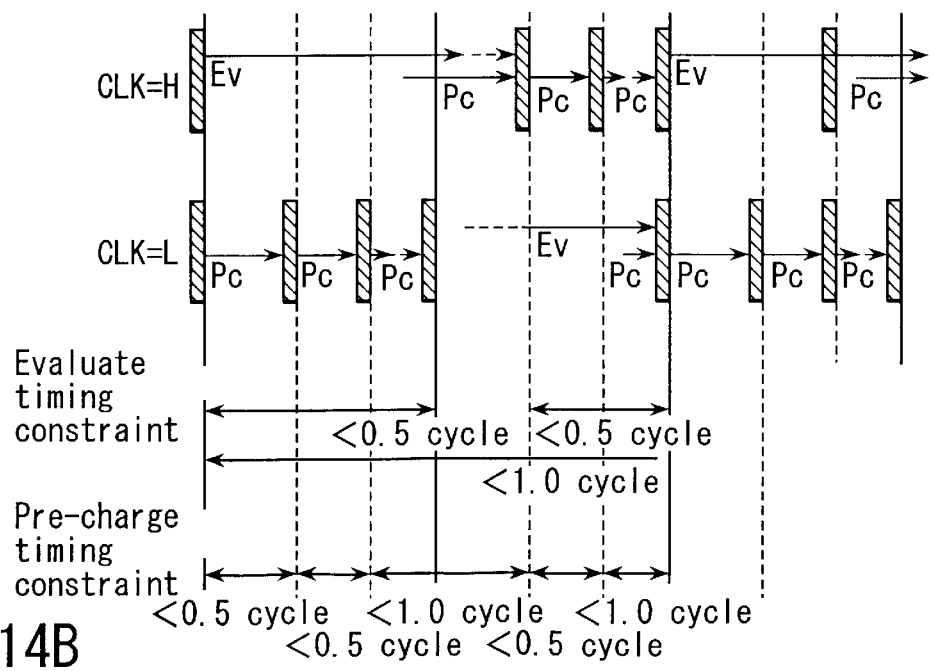
FIG. 14B is a schematic view of timing constraints of an evaluate (Ev) signal and a pre-charge (Pc) signal in the circuits shown in FIG. 14A.

FIG. 14A is a schematic diagram of the circuit arrangement of the semiconductor integrated circuit according to the fourth embodiment. FIG. 14B is a schematic diagram of timing constraint of evaluate signal (Ev) and pre-charge signal (Pc) in the circuit.

As shown in FIG. 14A, a flip-flop F21 is connected to a high-through latch HL21 via standard cells S21, S22, S23, S24 and S25. The high-through latch HL21 is connected to a flip-flop F22 via standard cells S26, S27, S28, S29 and S30. The flip-flop F22 is connected to a high-through latch HL22 via standard cells S31, S32, S33, S34 and S35. The standard cells S21, S23, S25, S26, S28, S30, S31, S33 and S35 each include a cMOS circuit without a clock signal. The standard cells S22, S24, S27, S29, S32 and S34 each include a cMOS circuit with a clock signal.

In the circuit so arranged, the flip-flop F21 outputs a pre-charge signal and simultaneously the standard cells S22, S24, S27, S29, S32 and S34, which connected to their respective paths of the succeeding stages, output a pre-charge signal, as shown in FIG. 14B. While the flip-flop F21 outputs an evaluate signal, the input nodes of the standard cells S22 and S24 in the paths of the succeeding stages, which receive the pre-charge signals, are rendered in an off state. The standard cells S22 and S24 in the paths can process the signals accordingly.

If the standard cells used in the third embodiment are replaced with standard cells that can output a pre-charge signal, the timing constraint of the pre-charge signal can be eased. As shown in FIG. 14B, the pre-charge signal has only to be transmitted within half a cycle from the flip-flop F21 to the standard cell S22 for pre-charging and from the standard cell S22 to the standard cell S24 for pre-charging. However, it has only to be transmitted within one cycle if a high-through latch HL21 is inserted between the standard cells.

Figure 15A:
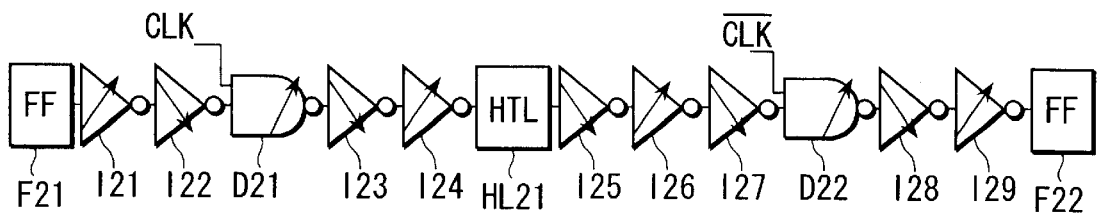
FIGS. 15A and 15B are circuit diagrams each showing a specific example of the semiconductor integrated circuit according to the fourth embodiment of the present invention.
Figure 15B:
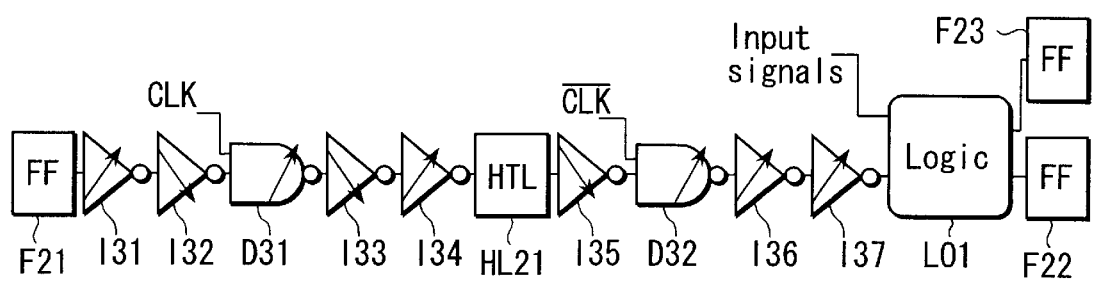

FIG. 15A shows a concrete example of the fourth embodiment in which a standard cell having a node for pre-charging is used. FIG. 15B shows another concrete example of the fourth embodiment in which a repeater is inserted in long-distance wiring and connected to another logic circuit.

In the example shown in FIG. 15A, inverters I21 and I22, a NAND circuit D21, and inverters I23 and I24, which are connected in series, are arranged between the flip-flop F21 and the high-through latch HL21. Further, inverters I25 to I27 a NAND circuit D22, and inverters I28 and I29, which are connected in series, are arranged between the high-through latch HL21 and the flip-flop F22.

In the example shown in FIG. 15B, inverters I31 and I32, a NAND circuit D31, and inverters I33 and I34, which are connected in series, are arranged between the flip-flop F21 and the high-through latch HL21. Further, an inverter I35, a NAND circuit D32, inverters I36 and I37, and a logic circuit LO1, which are connected in series, are arranged between the high-through latch HL21 and the flip-flops F22 and F23.

The arrangement and operations of the semiconductor integrated circuit according to the fourth embodiment are summarized as follows.

As depicted in FIG. 14A, the semiconductor integrated circuit includes standard cells S21 and S22 and a latch circuit HL21. In the standard cell S21, rise time when an output transitions from a low-level voltage to a high-level voltage and fall time when an output transitions from a high-level voltage to a low-level voltage differ from each other. The standard cell S22 has a clock terminal to which a clock signal is input and outputs one of high- and low-level voltages, which corresponds to a signal whose transition speed is slow, during one of high- and low-level periods of a clock signal. The latch circuit HL21 receives a pass signal that has passed through the standard cells S21 and S22. The standard cell S22 outputs the pass signal as it is during one of high- and low-level periods of the clock signal and holds the pass signal during the other period.

According to the fourth embodiment described above, the standard cells that can output a pre-charge signal are arranged between the flip-flops; therefore, the timing constraint of the pre-charge signal can be eased.

Fifth Embodiment

A semiconductor integrated circuit according to a fifth embodiment of the present invention will now be described. In the first to fourth embodiments, the circuit is designed on a flip-flop basis. In the fifth embodiment, however, the circuit is designed on a latch basis.

Figure 16A:
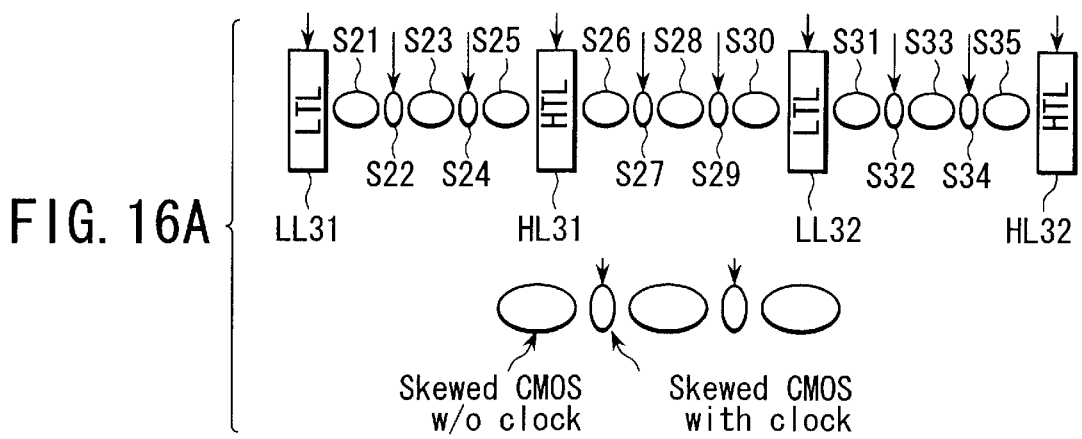
FIG. 16A is a schematic view of the arrangement of a semiconductor integrated circuit according to a fifth embodiment of the present invention.
Figure 16B:
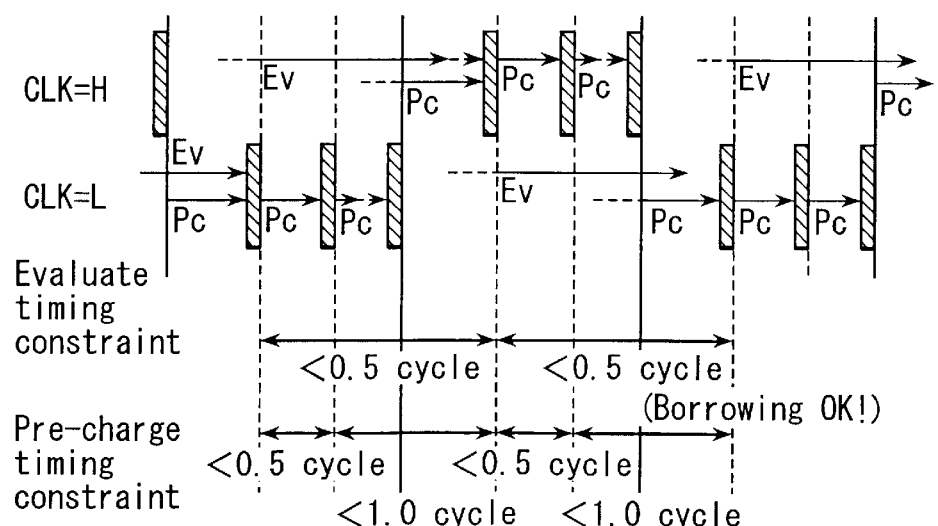
FIG. 16B is a schematic view of timing constraints of an evaluate (Ev) signal and a pre-charge (Pc) signal in the circuits shown in FIG. 16A.

FIG. 16A is a schematic diagram of the circuit arrangement of the semiconductor integrated circuit according to the fifth embodiment. FIG. 16B is a schematic diagram of timing constraint of evaluate signal (Ev) and pre-charge signal (Pc) in the circuit.

As shown in FIG. 16A, a low-through latch (LTL) LL31 is connected to a high-through latch HL31 via standard cells S21, S22, S23, S24 and S25. The high-through latch HL31 is connected to a low-through latch LL32 via standard cells S26, S27, S28, S29 and S30. The low-through latch LL32 is connected to a high-through latch HL32 via standard cells S31, S32, S33, S34 and S35.

In the circuit so arranged, too, a pre-charge signal is transmitted using the standard cells S22, S24, S27, S29, S32 and S34 for pre-charging shown in FIG. 16A. In the low-through latch LL31 closed while a clock signal is at a high level, an evaluate signal propagates through the path in the stage succeeding to the latch and passes through the high-through latch HL31 in the next stage during the period. The high-through latch HL31 opens while the clock signal is at a high level and closes while it is at a low level.

As shown in FIG. 16B, the pre-charge signal has only to be transmitted within half a cycle between the standard cells for pre-charging or from the standard cell S22 to the standard cell S24. However, it has only to be transmitted within one cycle if a high-through latch HL31 is inserted between the standard cells.

The evaluate signal has only to be transmitted within half a cycle between the latches or it has only to be transmitted to a latch within half a cycle from the position at which the evaluate signal arrives through the preceding latch until the latch is closed. For this reason, the borrowing of timing can be performed before and after the latch.

According to the fifth embodiment described above, the standard cells that can output a pre-charge signal are arranged between the latches; therefore, the timing constraint of the pre-charge signal can be eased.

Sixth Embodiment

A semiconductor integrated circuit according to a sixth embodiment of the present invention will now be described. In the sixth embodiment, standard cells that can output a pre-charge signal are arranged in a circuit with mixed flip-flops and latches.

Figure 17A:
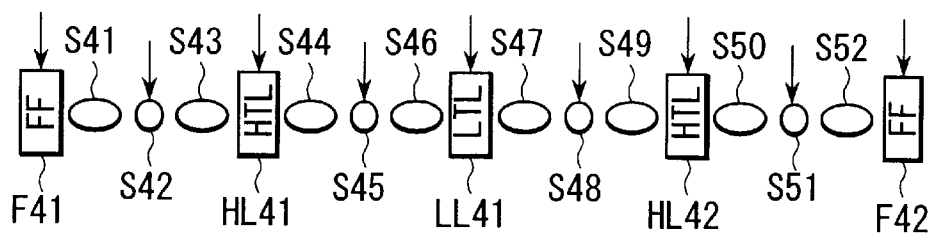
FIG. 17A is a schematic view of the arrangement of a semiconductor integrated circuit according to a sixth embodiment of the present invention.
Figure 17B:
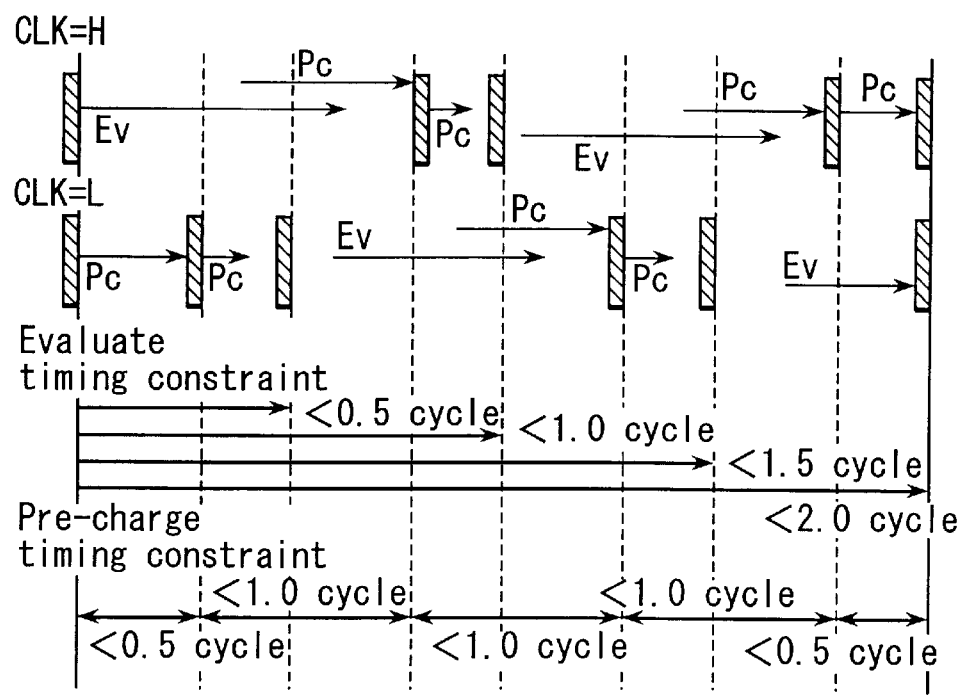
FIG. 17B is a schematic view of timing constraints of an evaluate (Ev) signal and a pre-charge (Pc) signal in the circuits shown in FIG. 17A.

FIG. 17A is a schematic diagram of the circuit arrangement of the semiconductor integrated circuit according to the sixth embodiment. FIG. 17B is a schematic diagram of timing constraint of evaluate signal (Ev) and pre-charge signal (Pc) in the circuit.

As shown in FIG. 17A, a flip-flop F41 is connected to a high-through latch HL41 via standard cells S41, S42 and S43. The high-through latch HL41 is connected to a low-through latch LL41 via standard cells S44, S45 and 46. The low-through latch LL41 is connected to a high-through latch HL42 via standard cells S47, S48 and S49. The high-through latch HL42 is connected to a flip-flop F42 via standard cells S50, S51 and S52. The standard cells S41, S43, S44, S46, S47, S49, S50 and S52 each include a cMOS circuit without a clock signal. The standard cells S42, S45, S48 and S51 each include a cMOS circuit with a clock signal.

As shown in FIG. 17B, the pre-charge signal has only to be transmitted within half a cycle from the flip-flop F41 to the standard cell S42 for pre-charging. However, it has only to be transmitted within one cycle if a high-through latch or low-through latch is inserted between the standard cells. The evaluate signal has only to be transmitted within half a cycle each between the latches.

Since the standard cells that can output a pre-charge signal are arranged between each flip-flop and each latch as shown in FIG. 17A, the speed of one-direction transition can be increased in the circuit.

Seventh Embodiment

A semiconductor integrated circuit according to a seventh embodiment of the present invention will now be described. In the design of a circuit using normal standard cells, the timings of signals input to these standard cells are different from each other; therefore, there is a possibility that a node in a path will makes a transition again and again. If the node makes a transition again and again, power consumption increases and slow transition occurs (due to a pre-charge signal), with the result that the transmission of signals is delayed.

Figure 18:
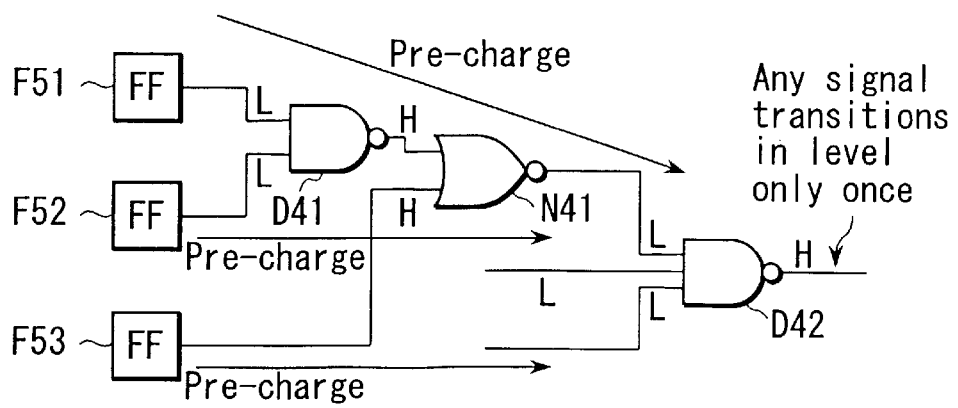
FIG. 18 is a circuit diagram of the arrangement of a semiconductor integrated circuit according to a seventh embodiment of the present invention.

In order to avoid the delay in signal transmission, as shown in FIG. 18, the levels of input node of NAND circuit D41, NOR circuit N41 and NAND circuit D42 are all caused to transition in the same direction by a pre-charge signal. Thus, the level of an output of each of the circuits D41, D42 and N41 transitions only once at the maximum. Consequently, no extra power consumption is required and a delay in signal can be prevented from increasing. If the level of input nodes of AND and OR circuits are all caused to transition in the same direction by a pre-charge signal, the same advantage can be obtained.

The arrangement and operations of the semiconductor integrated circuit according to the seventh embodiment are summarized as follows.

The semiconductor integrated circuit of the seventh embodiment includes flip-flops F51, F52 and F53 and a NAND circuit D41, a NOR circuit N41 and a NAND circuit D42 serving as standard cells. One of high- and low-level signals, which corresponds to a signal whose transition speed is slow, is supplied from the flip-flops F51, F52 and F53 to all the input nodes of the NAND circuit D41, NOR circuit N41 and NAND circuit D42.

According to the seventh embodiment described above, the input nodes of respective logic circuit elements are all caused to transition in the same direction by a pre-charge signal. Therefore, power consumption can be lowered and a delay in signal can be prevented from increasing.

A method of increasing the speed of a rise or fall transition in the standard cells used in the first to seventh embodiments will now be described as the following eighth to tenth embodiments.

Figure 19:
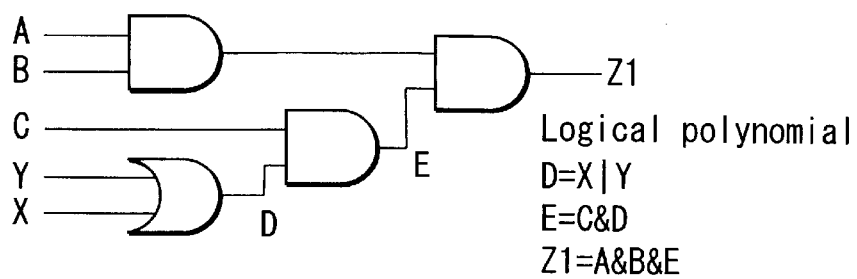
FIG. 19 is a logic circuit diagram showing an example of a standard cell.
Figure 20:
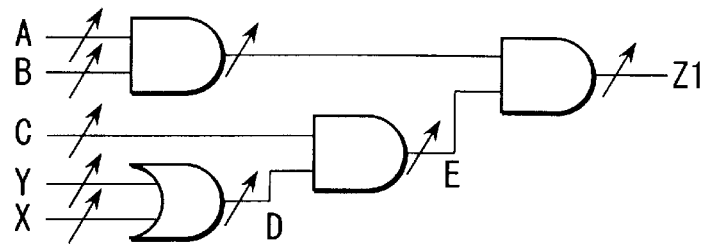
FIG. 20 is a logic circuit diagram of the standard cell shown in FIG. 19, in which a one-direction transition is made at high speed.

As described above, there is a method of increasing the speed of signal propagation by quickening a transition in signal in one direction (from high level to low level or from low level to high level) in the design of a circuit using standard cells. Let us consider a case where standard cells that increase the speed of a one-direction transition are applied to the circuit shown in FIG. 19. When all the cells are so designed that a transition from low level to high level (referred to as a rise transition hereinafter) increases in speed as shown in FIG. 20, the speed of the whole circuit increases 20% if the speed of a rise transition of each cell increases 20%. In FIG. 20, the arrows rising to the right indicate the rise transition.

In order to increase the speed of a standard cell in a transition direction, for example, in a rise transition direction, there is a method for increasing the gate width of a p-channel MOS transistor in the standard cell. However, the standard cell varies in height if the size of an n-channel MOS transistor is maintained in order to keep the speed of a transition from high level to low level (referred to as a fall transition hereinafter). The height of the standard cell corresponds to a distance between two power wires between which the p- and n-channel MOS transistors are sandwiched.

The standard cell can be common to the power wires by making the height constant (or an integral multiple of reference height) and the degree of flexibility in design is improved. If, therefore, the cell varies in height, it is difficult to replace or mix with a conventional one. Moreover, the area of the circuit is increased and so is a delay in wiring, with the result that the advantage of high-speed operations will be cancelled out.

The eighth embodiment described below proposes a layout capable of increasing the speed of transition in a specific direction without varying the height of a standard cell. In this layout, the threshold voltage of one of p- and n-channel MOS transistors drops to increase the speed of transition in a specific direction without changing the shape of the standard cell.

The ninth embodiment described below proposes a layout capable of increasing the speed of transition in one direction by varying a boundary between wells only in a transistor in a standard cell and matching the boundary at both ends of the cell while maintaining the height of the standard cell. When the layout of the eighth embodiment cannot be applied, if the threshold voltages of both the n- and p-channel MOS transistors are lowered to the limits, the width of the cell increases several percent to several tens of percent. However, the speed of transition can be increased in a specific direction without varying the height of the cell.

The tenth embodiment described below proposes a technique of increasing the speed of the entire circuit with efficiency when a transition increases in speed by varying a boundary between wells. When the boundary varies, a transition in a direction opposite to that of a high-speed transition becomes slow. In a circuit using complementary signals on a logical polynomial (including A and not-A), therefore, a standard cell cannot simply be increased in speed in the transition direction. According to the technique of the tenth embodiment, however, even the circuit using complementary signals can efficiently be increased in speed by duplicating part of the circuit.

Eighth Embodiment

Figure 21A:
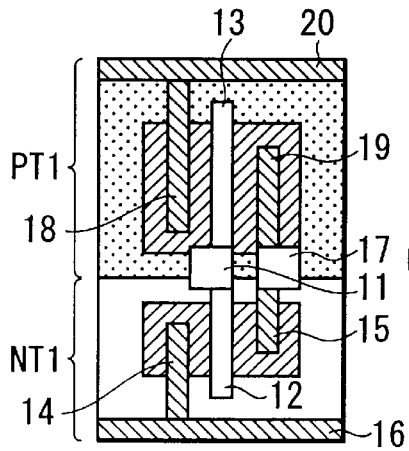
FIG. 21A is a layout of a standard cell forming a normal inverter.
Figure 21B:
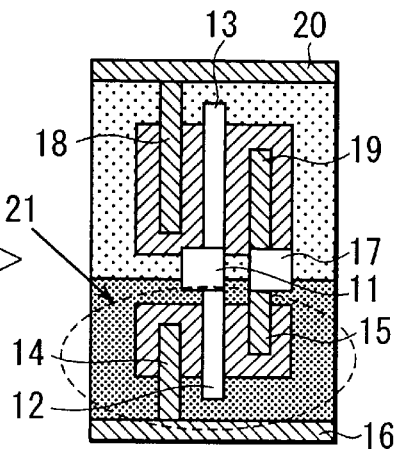
FIG. 21B is a layout of a standard cell forming an inverter that increases the speed of a fall transition in a semiconductor integrated circuit according to an eighth embodiment of the present invention.

A semiconductor integrated circuit according to an eighth embodiment of the present invention will now be described. FIG. 21A is a layout of a standard cell composing a normal inverter. FIG. 21B is a layout of a standard cell composing an inverter that increases the speed of a fall transition in the circuit of the eighth embodiment.

The standard cells shown in FIGS. 21A and 21B each includes an n-channel MOS transistor NT1 and a p-channel MOS transistor PT1. A gate electrode 12 of the n-channel MOS transistor NT1 and a gate electrode 13 of the p-channel MOS transistor PT1 are connected to an input electrode 11. A source electrode 14 and a drain electrode 15 are arranged such that the gate electrode 12 is interposed therebetween. The source electrode 14 is connected to a low-level voltage wire 16 and the drain electrode 15 is connected to an output electrode 17.

Further, a source electrode 18 and a drain electrode 19 are arranged such that the gate electrode 13 is sandwiched therebetween. The source electrode 18 is connected to a high-level voltage wire 20 and the drain electrode 19 is connected to the output electrode 17.

In the standard cell shown in FIG. 21B, the threshold voltage of the n-channel MOS transistor NT1 is lowered by varying the number of impurities ion-implanted into a channel region 21 of the n-channel MOS transistor NT1. Thus, the fall transition of the standard cell increases in speed. If the threshold voltage of the p-channel MOS transistor PT1 is not varied, the rise transition of the standard cell does not differ in speed from that of the normal standard cell as shown in FIG. 21A, in which the number of impurities is not varied.

The variations in threshold voltage can be handled during the process if a mask pattern is prepared for each threshold voltage in the ion implantation process. The shape of the standard cell shown in FIG. 21B can thus be made identical to that of the standard cell shown in FIG. 21A.

According to the eighth embodiment described above, the speed of a fall transition can be increased by lowering the threshold voltage of the n-channel MOS transistor by controlling the number of impurities implanted into the channel region of the n-channel MOS transistor.

Ninth Embodiment

In the above layout shown in FIG. 21B, the speed of a transition in a specific direction can be increased without changing the shape of the standard cell when the threshold voltage can be dropped. In a circuit that forms a critical path, however, there is a case where n- and p-channel MOS transistors increase in operation speed by lowering their threshold voltages to the limits. In this case, the speed of a transition cannot increase in each direction even by varying the threshold voltages.

In the ninth embodiment, therefore, the speed of a transition increases in each direction by shifting a boundary between well regions and varying the gate width of a transistor.

Figure 22A:
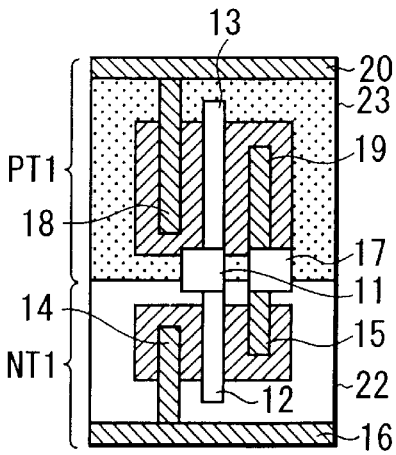
FIG. 22A is a layout of a standard cell forming a normal inverter.
Figure 22B:
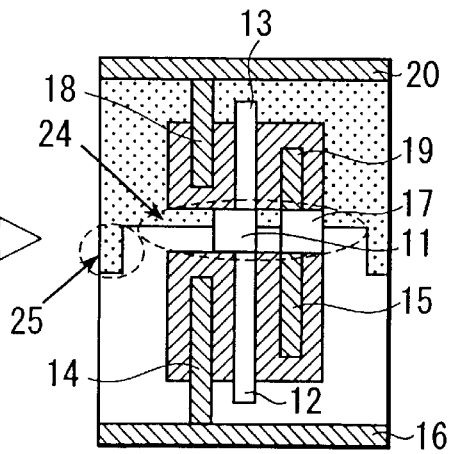
FIG. 22B is a layout of a standard cell in which the gate width of a transistor according to the ninth embodiment is changed.

FIG. 22A is a layout of a standard cell composing a normal inverter. FIG. 22B is a layout of a standard cell in which the gate width of a transistor according to the ninth embodiment is changed.

The standard cell shown in FIG. 22A includes a well region 22 in which an n-channel MOS transistor NT1 is formed and a well region 23 in which a p-channel MOS transistor PT1 is formed. In the standard cell shown in FIG. 21B, the well region 22 is broadened by changing a boundary 24 between the well regions 22 and 23. Thus, the gate width of the n-channel MOS transistor NT1 is increased and so is the speed of a fall transition of the standard cell.

If the well regions can freely be arranged as in a semiconductor substrate having an SOI structure, the boundary between them has only to be shifted. In a semiconductor substrate having no SOI structure, when the match between the positions of the well regions is required, a region 25 is formed at either end of the standard cell in order to match the boundary between the well regions to that between well regions in its adjacent standard cell.

While the height of the standard cell (distance between voltage wires 16 and 20) is maintained, the boundary between the well regions is shifted and the boundaries between the well regions in adjacent standard cells are matched to each other when the need arises. It is thus possible to increase the speed of each transition of the standard cell that lowers a threshold voltage.

According to the ninth embodiment described above, the well region of the n- or p-channel MOS transistor is broadened and the gate width thereof is increased, with the result that the speed of a fall transition or rise transition of the standard cell can be increased.

Tenth Embodiment

In the layout shown in FIG. 22B, the standard cell increases in speed by shifting the boundary between the well regions, so that it is delayed in a transition direction opposite to a transition direction in which the standard cell is to increase in speed. When a circuit that is expressed by a logical polynomial using complementary signals includes both "A" and "not-A", there is a case where a transition cannot increase in speed for each standard cell. In other words, there is a case where the speed of only one of rise and fall transitions cannot increase without varying that of the other transition in a standard cell.

Figure 23:
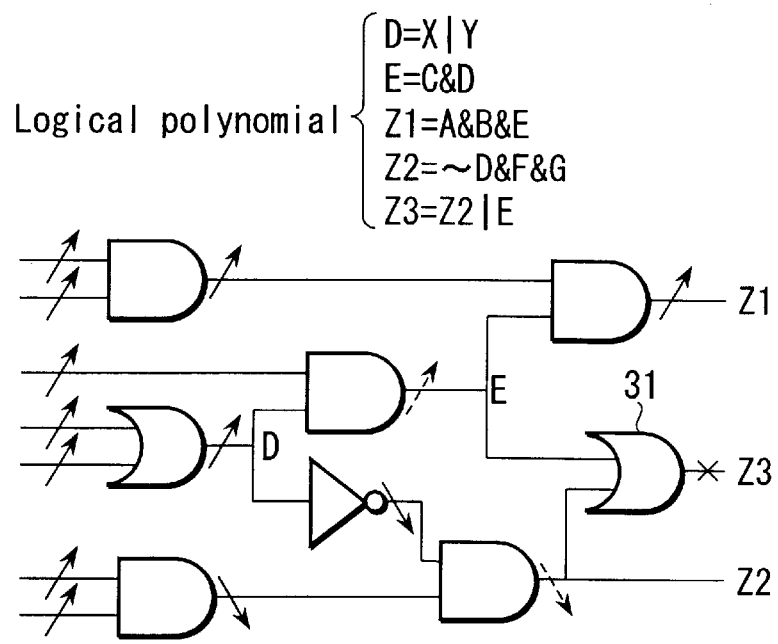
FIG. 23 is a logic circuit diagram showing an example where no transition can be increased in speed for each standard cell.

FIG. 23 shows a logic circuit in which a transition cannot increase in speed for each standard cell. In the circuit shown in FIG. 23, both the rise and fall transitions can be increased in speed in output signals Z1 and Z2. In an output signal Z3, however, the speeds of output signals E and Z2 are always increased in opposite directions; therefore, the transition of an OR circuit 31 to which these signals are input cannot be increased in speed in one direction.

A logic circuit that requires "D" and "~D" in order to generate a signal such as signal Z3 in the circuit shown in FIG. 23, such as a select circuit that selects one of signals "D" and "~D", frequently appears during the design phase. In the tenth embodiment, a technique capable of a high-speed operation even in the circuit shown in FIG. 23 is proposed by duplicating part of the circuit.

Figure 24:
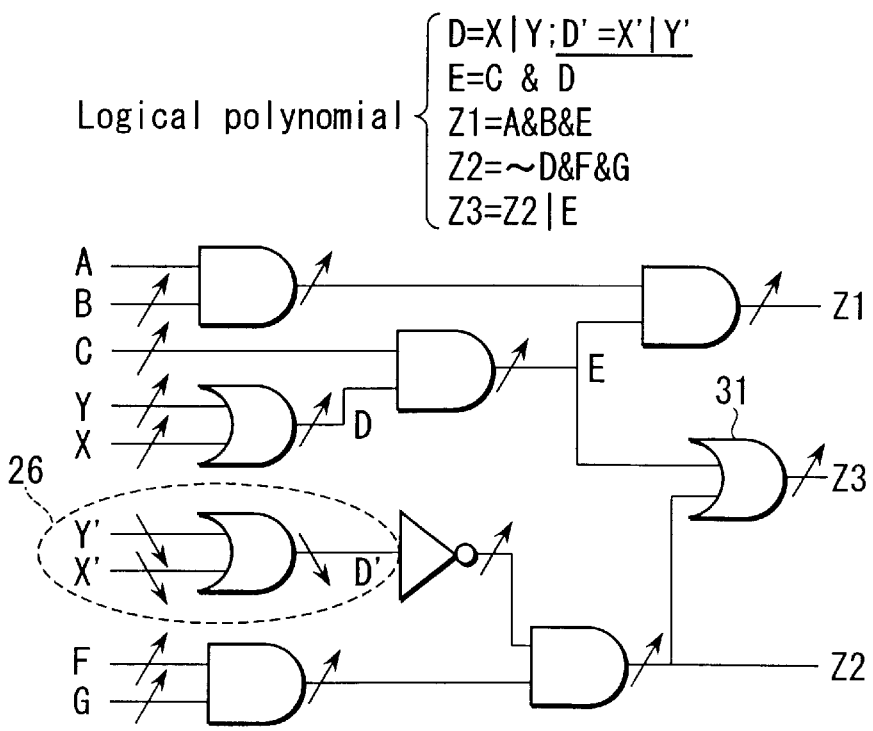
FIG. 24 is a logic circuit diagram showing a high-speed technique of a semiconductor integrated circuit according to a tenth embodiment of the present invention.

FIG. 24 is a logic circuit having a layout for achieving the technique of the tenth embodiment.

In order to increase the operation speed of the logic circuit shown in FIG. 23, a circuit for generating a signal D used complementarily in the logic circuit is duplicated to form a logic circuit 26. If a signal generated form the logic circuit 26 is D', the circuits for generating signals D and D' can determine their respective directions of transition to be increased in speed. The speed of a rise transition increases in the generation circuit of signal D, while that of a fall transition increases in the generation circuit of signal D'. The speed of a rise transition in a circuit for generating a signal Z3 can thus be increased. Consequently, all the standard cells shown in FIG. 24 can be increased in speed in one of rise and fall transition directions and accordingly the whole circuit composed of the standard cells can be increased in speed.

Figure 25:
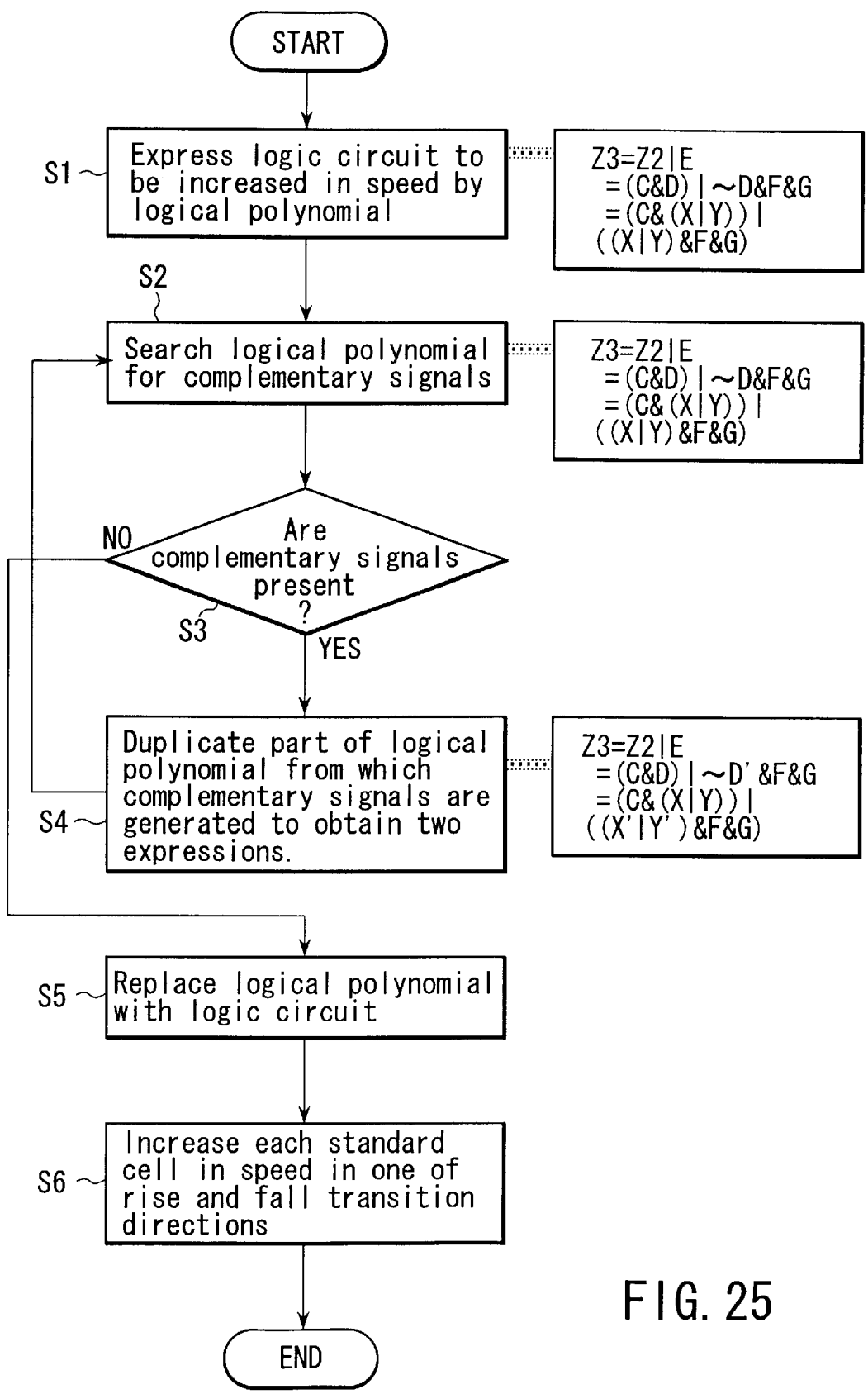
FIG. 25 is a flowchart showing a procedure for duplicating a circuit for generating signal D in the high-speed technique according to the tenth embodiment of the present invention.

FIG. 25 is a flowchart showing a procedure for duplicating a circuit for generating signal D in the above technique according to the tenth embodiment.

First, a logic circuit to be increased in speed is expressed by a logical polynomial (step S1). Then, the logical polynomial is searched (step S2) to determine whether complementary signals are present or not (step S3). If complementary signals are present, part of the logical polynomial from which the signals are generated is duplicated to obtain two expressions (step S4). The processing from step S2 to step S4 is repeated until no complementary signals are detected.

If no complementary signals are detected, the duplicated logical polynomial is replaced with a logic circuit (step S5). After that, each of standard cells increases in speed in one of rise and fall transition directions (step S6).

The foregoing procedure for designing a semiconductor integrated circuit according to the tenth embodiment is summarized as follows. The method comprises steps S1 to S6. In step S1, a logic circuit having standard cells is expressed by a logical polynomial. In steps S2 and S3, the logical polynomial is searched to determine whether complementary signals are present or not. In step S4, when complementary signals are detected, a logical polynomial for generating the complementary signals is duplicated to obtain two expressions. In step S5, a logic circuit is generated in accordance with the duplicated logical polynomial. In step S6, one of rise and fall transition increases in speed in each of the standard cells.

According to the tenth embodiment described above, a circuit for generating a complementarily used signal D is duplicated, and transitions to be increased in speed are determined by the respective circuits. Therefore, the whole circuit composed of standard cells can be increased in speed.

The semiconductor integrated circuits according to the above embodiments of the present invention can be increased in speed using standard cells having a cMOS circuit that increases in speed in only one transition direction. Since the semiconductor integrated circuits are basically composed of cMOS circuits, they can process both positive logic and negative logic. They do not have the problem of the increase in the number of logic stages, which is caused in a domino circuit and a circuit unsusceptible to noise can be designed. In other words, the above embodiments allow signals to be transmitted at high speed in the semiconductor integrated circuits and a high-speed LSI can be designed accordingly. Since, moreover, the circuits are more unsusceptible to noise than the domino circuit and can process negative logic as well as positive logic, there is no problem of increasing the number of logic stages.

According to the above-described embodiments, there can be provided a semiconductor integrated circuit that does not increase in logic stages but can be designed against noise and increase in signal transmission speed.

The foregoing embodiments can be executed alone or in proper combination. Each of the embodiments includes inventions in various stages, and the inventions can be extracted by appropriately combining a plurality of components of the respective embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a standard cell in which rise time when an output transitions from a low-level voltage to a high-level voltage and fall time when an output transitions from the high-level voltage to the low-level voltage differ from each other; and
   a flip-flop which outputs a first input signal, which is input in a cycle immediately before a clock signal in synchronization with one of rise and fall of the clock signal, to the standard cell and then fixes an output at one of a high-level voltage and a low-level voltage, the flip-flop being provided in a stage precedent to the standard cell, wherein before a second input signal, which is output from the flip-flop after the first input signal, reaches the standard cell, an output of the standard cell is set at one of a high-level voltage and a low-level voltage, which corresponds to a signal whose transition speed is slow, by one of the high-level voltage and the low-level voltage that is output from the flip-flop.

2. The semiconductor integrated circuit according to claim 1, wherein a high-level period of the clock signal and a low-level period thereof differ from each other.

3. The semiconductor integrated circuit according to claim 1, wherein one of the high-level voltage and the low-level voltage, which corresponds to a signal whose transition speed is slow, is applied to all input nodes of the standard cell.

4. The semiconductor integrated circuit according to claim 1, wherein the standard cell includes an n-channel MOS transistor and a p-channel MOS transistor, and one of the n-channel MOS transistor and the p-channel MOS transistor decreases in threshold voltage to thereby increase the speed of one of a transition from the low-level voltage to the high-level voltage and a transition from the high-level voltage to the low-level voltage.

5. The semiconductor integrated circuit according to claim 1, wherein the standard cell includes an n-channel MOS transistor and a p-channel MOS transistor, and a boundary between a well region in which the n-channel MOS transistor is formed and a well region in which the p-channel MOS transistor is formed is varied in the standard cell to thereby broaden a width of a gate of one of the n-channel MOS transistor and the p-channel MOS transistor.

6. A semiconductor integrated circuit comprising:
a standard cell in which rise time when an output transitions from a low-level voltage to a high-level voltage and fall time when an output transitions from the high-level voltage to the low-level voltage differ from each other; and
a flip-flop which outputs an input signal, which is input in a cycle immediately before a clock signal, during one of a high-level period and a low-level period of the clock signal and fixes an output at one of a high-level voltage and a low-level voltage during other period, the flip-flop being provided in a stage precedent to the standard cell,
wherein the flip-flop sets an output of the standard cell at one of a high-level voltage and a low-level voltage, which corresponds to a signal whose transition speed is slow, before the flip-flop outputs the input signal.

7. The semiconductor integrated circuit according to claim 6, wherein the high-level period of the clock signal and the low-level period thereof differ from each other.

8. The semiconductor integrated circuit according to claim 6, further comprising a latch circuit which outputs an input signal as it is during one of the high-level period and the low-level period of the clock signal and latches the input signal during other period,
wherein the latch circuit is closed while the flip-flop outputs one of a high-level voltage and a low-level voltage, which corresponds to a signal whose transition speed is slow, to prevent the one of the high-level voltage and the low-level voltage from reaching a flip-flop in a stage subsequent to the flip-flop.

9. The semiconductor integrated circuit according to claim 6, further comprising a standard cell which has a clock terminal supplied with the clock signal and outputs one of the high-level voltage and the low-level voltage, which corresponds to a signal whose transition speed is slow, during one of the high-level period and the low-level period of the clock signal.

10. The semiconductor integrated circuit according to claim 6, wherein one of the high-level voltage and the low-level voltage, which corresponds to a signal whose transition speed is slow, is applied to all input nodes of the standard cell.

11. The semiconductor integrated circuit according to claim 6, wherein the standard cell includes an n-channel MOS transistor and a p-channel MOS transistor, and one of the n-channel MOS transistor and the p-channel MOS transistor decreases in threshold voltage to thereby increase the speed of one of a transition from the low-level voltage to the high-level voltage and a transition from the high-level voltage to the low-level voltage.

12. The semiconductor integrated circuit according to claim 6, wherein the standard cell includes an n-channel MOS transistor and a p-channel MOS transistor, and a boundary between a well region in which the n-channel MOS transistor is formed and a well region in which the p-channel MOS transistor is formed is varied in the standard cell to thereby broaden a width of a gate of one of the n-channel MOS transistor and the p-channel MOS transistor.

13. A semiconductor integrated circuit comprising:
a first standard cell in which rise time when an output transitions from a low-level voltage to a high-level voltage and fall time when an output transitions from the high-level voltage to the low-level voltage differ from each other;
a second standard cell which has a clock terminal supplied with the clock signal and outputs one of a high-level voltage and a low-level voltage, which corresponds to a signal whose transition speed is slow, during one of the high-level period and the low-level period of the clock signal; and
a latch circuit which receives a pass signal that passes the first standard cell and the second standard cell, outputs the pass signal as it is during one of the high-level period and the low-level period of the clock signal, and latches the pass signal during other period.

14. The semiconductor integrated circuit according to claim 13, wherein the high-level period of the clock signal and the low-level period thereof differ from each other.

15. The semiconductor integrated circuit according to claim 13, wherein one of the high-level voltage and the low-level voltage, which corresponds to a signal whose transition speed is slow, is applied to all input nodes of the first and second standard cells.

16. The semiconductor integrated circuit according to claim 13, wherein the first standard cell includes an n-channel MOS transistor and a p-channel MOS transistor, and one of the n-channel MOS transistor and the p-channel MOS transistor decreases in threshold voltage to thereby increase the speed of one of a transition from the low-level voltage to the high-level voltage and a transition from the high-level voltage to the low-level voltage.

17. The semiconductor integrated circuit according to claim 13, wherein the first standard cell includes an n-channel MOS transistor and a p-channel MOS transistor, and a boundary between a well region in which the n-channel MOS transistor is formed and a well region in which the p-channel MOS transistor is formed is varied in the first standard cell to thereby broaden a width of a gate of one of the n-channel MOS transistor and the p-channel MOS transistor.

* * * * *